(12) United States Patent
Hirler (10) Patent No.: US 8,247,865 B2
(45) Date of Patent: Aug. 21, 2012

(54) SEMICONDUCTOR STRUCTURE, METHOD FOR OPERATING A SEMICONDUCTOR STRUCTURE AND METHOD FOR PRODUCING A SEMICONDUCTOR STRUCTURE

(75) Inventor: Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 1357 days.

(21) Appl. No.: 11/543,732

(22) Filed: Oct. 5, 2006

(65) Prior Publication Data

US 2007/0108511 A1    May 17, 2007

(30) Foreign Application Priority Data

Oct. 6, 2005 (DE) .......................... 10 2005 048 030
Nov. 4, 2005 (DE) .......................... 10 2005 052 734

(51) Int. Cl.
*H01L 29/76* (2006.01)
(52) U.S. Cl. .......................... 257/330; 257/331; 257/332
(58) Field of Classification Search .................. 257/339, 257/335, 331, 332, 328–330
See application file for complete search history.

(56) References Cited

U.S. PATENT DOCUMENTS

| 6,362,505 B1 | 3/2002 | Tihanyi |
| 6,586,800 B2 | 7/2003 | Brown |
| 7,091,573 B2 | 8/2006 | Hirler et al. |
| 7,173,306 B2 * | 2/2007 | Hirler et al. .................. 257/329 |
| 7,345,342 B2 * | 3/2008 | Challa et al. .................. 257/341 |
| 2003/0047777 A1 | 3/2003 | In't Zandt et al. |
| 2003/0173619 A1 | 9/2003 | Feldtkeller et al. |
| 2003/0178676 A1 * | 9/2003 | Henninger et al. ........... 257/340 |
| 2004/0021173 A1 | 2/2004 | Sapp |
| 2004/0089910 A1 * | 5/2004 | Hirler et al. .................. 257/500 |
| 2005/0001264 A1 | 1/2005 | Ono et al. |
| 2006/0049454 A1 * | 3/2006 | Thapar .......................... 257/330 |

FOREIGN PATENT DOCUMENTS

| DE | 198 54 915 C2 | 9/2002 |
| DE | 102 34 996 A1 | 10/2003 |
| EP | 1 291 907 A2 | 3/2003 |
| WO | WO 2005/053031 A2 | 6/2005 |

* cited by examiner

*Primary Examiner* — Eugene Lee
(74) *Attorney, Agent, or Firm* — Maginot, Moore & Beck (57) ABSTRACT

A semiconductor structure has a substrate with a first main surface and a second main surface, the substrate comprising a gate electrode region, a channel region, wherein a conductive channel can be generated, and a gate electrode insulation between the gate electrode region and the channel region. Further, a field electrode region with a curved external surface is provided for increasing a breakdown voltage of the semiconductor structure, wherein the field electrode region has an extension in every direction in parallel to the first main surface, which is lower than a maximum extension in the one direction perpendicular to the second main surface.

61 Claims, 7 Drawing Sheets

SEMICONDUCTOR STRUCTURE, METHOD FOR OPERATING A SEMICONDUCTOR STRUCTURE AND METHOD FOR PRODUCING A SEMICONDUCTOR STRUCTURE

CROSS-REFERENCE TO RELATED APPLICATION

This application claims priority from German Patent Application No. 102005048030.6, which was filed on Oct. 10, 2005, and from German Patent Application No. 102005052734.5, which was filed on Nov. 4, 2005 and which are incorporated herein by reference in their entirety.

FIELD OF THE INVENTION

The present invention relates to a semiconductor structure with a vertical channel and particularly to semiconductor structures with a vertical channel and a field electrode region for increasing a breakdown voltage.

DESCRIPTION OF THE RELATED ART

When developing new generations of power transistors, such as DMOS power transistors, it is an important aim to obtain the reduction of the specific turn-on-resistance Ron·A. Thereby, on the one hand, the static power dissipation can be minimized, on the other hand, higher current densities can be obtained.

In the art, field plate trench transistors are known, which allow, for example, for LV power MOSFETs the lowest turn-on-resistances. However, nowadays, in a known transistor cell, mesa widths down to 0.4 micrometers are realized, wherein the trench width is often two to three times higher than the mesa width. Here, mesa width means the widths of the mesa region, i.e. the region limited by the gate structure or the gate trench, respectively. Such structures are realized in strip shape or hexagonal cell shape, wherein the trench region is contiguous and comprises hexagonal mesa regions. An example for such a realization is described in US 20030047777A1.

Further, in the field of transistors with planar channel, i.e. a channel formed in parallel to a main surface of the substrate, the usage of field plates in combination with the planar surface channel is known.

DE 19854915 C2 describes, for example, the usage of auxiliary electrodes, which can be formed, for example, "pencil-like". However, due to the extension in parallel to the main surface of a substrate, the planar channel requires very large cells in the range of multiples of a micrometer, whereby such structures are no longer useful for current LV transistors, due to the high Ron·A. Thus, since the mesa region is significantly wider than the trenches, the "pencil-like" design of the field plates has the disadvantage that the curvature of the trench walls in the top view leads to a drastic compression of the lateral portion of the field lines, in a ratio $p/w_T$, wherein $w_T$ refers to the trench width and p the cell pitch. Typical ratios of $p/w_T$ are in a range of 5 to 20. This concentration of the field lines has the effect that compared to transistors with planar channel and strip-shaped field plate arrangement, only a very small portion of the breakdown voltage is obtained.

One possibility to obtain a low turn-on-resistance, even with small cell sizes, is to apply a positive voltage to the field electrode of a field plate trench transistor, wherein the voltage dropping across the field oxide is reduced in the cut-off case and a thinner field oxide and smaller trench widths are enabled. However, it is a disadvantage that it is difficult to provide such voltage sources with sufficiently low internal resistance on a chip.

SUMMARY OF THE INVENTION

It is an object of at least one embodiment of the present invention to provide compact semiconductor structures with a vertical channel, which have a low turn-on-resistance.

In accordance with a first aspect, the present invention provides a semiconductor structure, having: a substrate with a first main surface and a second main surface; a gate electrode region; a channel region, wherein a vertical conductive channel can be generated in the direction from the first main surface to the second main surface; a gate electrode insulation between the gate electrode region and the channel region; and a field electrode region with a curved external surface from increasing a breakdown voltage of the semiconductor structure, wherein the electrode region has an extension in every direction in parallel to the first main surface, which is lower than a maximum extension in a direction perpendicular to the first main surface.

In accordance with a second aspect, the present invention provides a semiconductor structure, having a substrate with a first main surface and a second main surface; a gate electrode region comprising a plurality of spatially spaced gate electrode subregions; a channel region, wherein a vertical conductive channel can be generated in the direction from the first main surface to the second main surface; a gate electrode insulation between the gate electrode region and the channel region; and a spatially closed field electrode region with a curved external surface, which extends in a region having no gate electrode regions between the plurality of spatially spaced gate electrode regions.

In accordance with a third aspect, the present invention provides a semiconductor structure, having: a substrate with a first main surface and a second main surface; a gate electrode region; a channel region, wherein a vertical conductive channel can be generated in the direction from the first main surface to the second main surface; a gate electrode insulation between the gate electrode region and the channel region; a field electrode region with a curved external surface, wherein the gate electrode region has an elongated strip portion, wherein the field electrode region is arranged such that an electric effective field from increasing a breakdown voltage of the semiconductor structure can be generated across the curved external surface, which is at least partly parallel to the elongated strip portion.

In accordance with a fourth aspect, the present invention provides a method for operating one of the above-mentioned semiconductor structures, having the step of: applying a voltage to the field electrode region, whereby a lateral electric field is generated, which increases the breakdown voltage of the semiconductor structure.

In accordance with a fifth aspect, the present invention provides a method for producing a semiconductor structure, having the steps of: providing a substrate with a first main surface and a second main surfaced; generating a gate electrode region in the substrate; generating a channel region, wherein a vertical conductive channel can be generated in the direction from the first main surface to the second main surface; generating a gate electrode insulation between the gate electrode region and the channel region; and generating a field electrode region with a curved external surface for increasing a breakdown voltage of the semiconductor structure, wherein the field electrode region has an extension in every direction in parallel to the first main surface, which is lower than a maximum extension in the direction perpendicular to the first main surface.

The present invention is based on the knowledge that for obtaining a semiconductor structure with vertical channel, which is at the same time compact and has a low turn-on-resistance, region, since the trench region is inactive for the current flow. Thereby, a further miniaturization of the structures can be obtained in comparison to known structures, without increase of the turn-on-resistance, or with the same structural size, the mesa cross section is significantly increased in top view, which causes a reduction of the turn-on-resistance. According to the invention, this can be obtained in that the field electrode region has a curved outer surface. A curved external surface means particularly an external surface comprising a normal vector, i.e. a vector perpendicular to the area, which comprises at least two different directions in space. Preferably, the external surface of the field electrode region has a curved structure, for example a circular form, a square form or n-angular angular form, in the projection on a main surface of the substrate, wherein the semiconductor structure is formed. Preferably, the external surface extends in a direction perpendicular to the main surface in a linear or straight way, so that the external surface has, for example, a cylinder shape or cuboid shape. The cross-sectional area in a sectional view in parallel to the main surface can remain the same in form and shape with increasing distance from the main surface, or can taper off, so that the external surface can have a cone shape or a pyramid shape.

Further, the invention is based on the knowledge that the gate electrode is arranged in gate trenches for reducing the turn-on-resistance, since thereby the cell density can be increased. The channel width increased thereby causes a reduction of the channel proportion of the overall turn-on-resistance. By displacing the channel end to the lower end of the body region, the so-called JFET resistance between the body areas is omitted with planar channel. However, the gate electrode is not disposed in the needle-shaped field electrode trench, since this has the disadvantage of a low channel width, and it is too expensive and requires additional space to connect the gate electrode individually with gate lines and the gate pad.

In one aspect, the curved external surface allows to design the field electrode range in a compact way, i.e., e.g., needle-shaped. According to the invention, this is obtained by providing a field electrode region, which has a maximum extension in parallel to a main surface of a substrate, which is smaller than a maximum extension perpendicular to the main surface, i.e. into the substrate. A preferred ratio of the maximum horizontal extension to the maximum vertical extension of the field electrode region is between 0.05 and 0.5. Particularly preferable, the field electrode region is designed in a needle-shaped way, i.e. it has a very large ratio of the maximum horizontal extension to the maximum vertical extension in a range of 0.05 to 0.25. With needle-shaped design, a typical ratio of $p/w_T$ results in the range of 1.2 to 1.6 due to the curvature of the trench walls. This causes a slightly reduced breakdown voltage of the device, but the same can be balanced out by a slightly thicker drift zone with deeper trenches. The turn-on-resistance, which is slightly increased thereby, is overcompensated by the larger mesa area in the top view, so that overall a lower turn-on-resistance results.

The field electrode range can be disposed in a field plate trench, which preferably also comprises the above-mentioned regions.

The needle-like design, as described above, allows that a larger drift zone region is depleted per field plate region, then would be the case with strip-shaped or hexagonally surrounding field plate, as is known in the prior art. For achieving, for example, complete depletion, a lower space of the field electrode region, i.e. a lower cross-sectional extension of the field electrode range in parallel to the main surface of the substrate is required, so that the area of a charge transport region available for electrical conduction, for example a drain-drift region of the semiconductor structure, is increased.

According to a second aspect, the inventive curved external surface can be arranged such that it is possible to deplete two directions in space of a semiconductor region in a intermediate region of the gate electrodes, while in a strip-shape, as known in the prior art, merely one direction in space is depleted. If a spatially closed field electrode region is arranged with the inventive curved external surface in an intermediate region of the gate electrodes, where no gate electrode structures are provided, it is obtained that a field electrode region arranged in that way has an effect on each of the gate electrode structures surrounding the gate. Thereby, effective depletion of the semiconductor structures associated to the gate structures is obtained, wherein by the above arrangement with regard to the prior art, also a larger semiconductor region, for example a drift zone region per field electrode region can be depleted.

According to a third aspect of the present invention, in relation to a gate electrode elongating in parallel to the main surface, the curved external surface has such a form, that in one portion of the curved external surface, an electric effective field for increasing the breakdown voltage of the semiconductor structure is generated in parallel to the longitudinal portion of a gate electrode region. Contrary to the prior art, an electric effective field does not only effective perpendicular to the longitudinal gate structures, but also in parallel or tangential, respectively, to the gate structures. Preferably, the electric effective field strength generated by the field electrode region has an effect in all directions in space, so that a particularly preferred effect is obtained. Here, electric effective field means the electric field resulting due to depleting charge carriers in a semiconductor region of the structure, for example in the drain-drift zone, by the remaining acceptor or donator charges on the one hand, and the charges generated in the field electrode region on the other hand.

Thus, the above-described aspects of the present invention have the same specific technical context that a curved external surface ensures that an electric effective field can be generated at the desired effective location not only in one direction but in a plurality of directions, which is suitable for depleting semiconductor regions from charge carriers and to thereby increase the breakdown field strength of the semiconductor element. It is a further advantage that due to the lower extension of the field electrode regions a lower capacitance results compared to other semiconductor structures or regions. For example, the gate-drain capacitance can be reduced in one embodiment. Above that, in contrast to the usage of field plates, the semiconductor region is not dissected by the field electrode region in parallel to the substrate main surface, but a contiguous area remains, which has a favorable effect on the charge transport.

In top view, the field electrode region on a main surface of the substrate can be, for example, circular, star-shaped, ring-shaped, rectangular, cuboid-shaped or hexagonal. Respective further n-angular structures are also possible. Round shapes are advantageous to avoiding field peaks. Preferably, the field electrode region limited by the external surface is fully filled with a conductive material, so that the field electrode region has no inner surface, wherein the field electrode region is electrically insulated from the semiconductor region by electric insulation. This allows a particularly compact needle-shaped arrangement, so that very low space consumption is obtained by the field electrode region.

According to one embodiment, the semiconductor structure can have a gate electrode area having a plurality of gate strips. The gate strips can be arranged diagonally to each other, so that a grid-shaped gate electrode structure is obtained. This is advantageous when the mesa width is greater than the gate trench width, since thereby the channel width is maximized. Particularly preferred, the grid-shape can be hexagonal or square, since the field electrode region can be arranged in a compact way in the center of the mesa region in the mesa regions formed between the grid electrode regions, so that a distance from the field electrode region to the points in the mesa region is minimized, for example to a drain-drift region. Thereby, a particularly effective effect is obtained.

In one embodiment, the field electrode region can be disposed between two gate electrode strips running in parallel. The needle-shaped field electrode regions can also be disposed below a gate electrode strip. Particularly, the field electrode regions can also be formed in a spatially contiguous way with the gate electrode strips, whereby an electric connection of the same is obtained.

In a further embodiment, a gate strip can be provided, which splits into two gate electrode subregions spaced apart from each other, in a top view on a main surface of the substrate at predetermined positions so that a field electrode region is fully surrounded by the split gate electrode region.

The field electrode region can be disposed in a trench, which is fully or partly surrounded by an insulating layer. In a particularly preferred embodiment, the gate region can also be disposed in the field electrode trench, wherein the gate region can be electrically insulated from the field electrode region or not. Here, the field electrode region can be placed below the gate electrode across the whole trench length, so that a reduction of the gate-drain capacitance is obtained, which represents a particularly advantageous effect. Thereby, needle-shaped recesses are provided, which allow the depletion of the drift zone. Thereby, it is also possible to contact the field electrode in a space-saving way at the edge of the transistor. Another advantage of this embodiment that merely one trench is etched, so that a cost-effective production is obtained. Thereby, the fact that the trench etch processes show a dependence of the trench depth from the trench width can be utilized, so that needle-shaped recesses can be defined across the trench width.

If the field plate region is connected to a gate potential, or, as described above, the field electrode region and the gate electrode region are formed in a spatially contiguous way, so that the same are connected to each other in an electrically conductive way, an increased gate-drain capacitance results. The advantage compared to the known field plate trenches in strip-shape with gate electrodes for depletion is that a reduced gate-drain capacitance is obtained with sufficient distances of the field plate regions arranged in a spatially local way.

Particularly preferred, the field electrode region can also serve for the realization of a sidewall contact to a source and/or body region.

For reducing the gate-drain capacitance or a gate charge, respectively, an oxide, which is thick in relation to the gate oxide, or a field plate electrically insulated from the gate can be provided on the bottom of the gate trench, preferably on the source potential.

Further, as described above, the field electrode region can be connected to source potential, wherein in a particularly preferred embodiment a voltage is applied to the field electrode region, so that the electric turn-on-resistance Ron·A. can be further reduced by an accumulation channel.

The field electrode region can comprise a plurality of spatially closed field electrode subregions, which are disposed spaced apart from each other. The centers of the same can be formed in a regular arrangement at grid points of a regular grid, which preferably corresponds to the grid formed by the gate electrode structure.

The present invention can be used in field-effect transistors with vertical channel, drain-up structures and p-channel transistors as well as with IGBTs.

An electric connection to the field electrode region can be obtained by a metal layer deposited on the full area, which can also serve for contacting the source region of a transistor, which allows a particularly simple production method. In a further embodiment, contact vias can be provided, which are etched into an insulating layer at predetermined positions, for obtaining contacting of the field electrode region of the source region and the body region or other electrically conductive regions.

In one production method, the field electrode region can be directly connected to the source metallization without additional steps, as described above. In a further embodiment, the field electrode region trench can, for example, be only etched after contact via etching. Thereby, the metallization or a metallization plug can be used as field electrode, whereby polysilicon deposition can be omitted, which reduces the production cost.

In a preferred method for operating the inventive semiconductor structure, a voltage is applied to the field electrode region, which has the effect that the electric fields across the insulation layer are reduced in the cut-off case, whereby the electric insulation layer can be designed thinner and thus more space-saving. In the on state, a positive voltage causes an accumulation channel, which reduces the turn-on-resistance.

BRIEF DESCRIPTION OF THE DRAWINGS

These and other objects and features of the present invention will become clear from the following description taken in conjunction with the accompanying drawings, in which:

FIG. 1b is a top view on the semiconductor structure illustrated in FIG. 1a;

FIG. 3b is a schematic cross-sectional illustration of the semiconductor structure shown in FIG. 3a;

FIG. 4b is a schematic cross-sectional illustration of the semiconductor structure illustrated in FIG. 4a;

FIG. 5b is a schematic cross-sectional representation of the semiconductor structure illustrated in FIG. 5a;

DESCRIPTION OF THE PREFERRED EMBODIMENTS

Figure 1A:
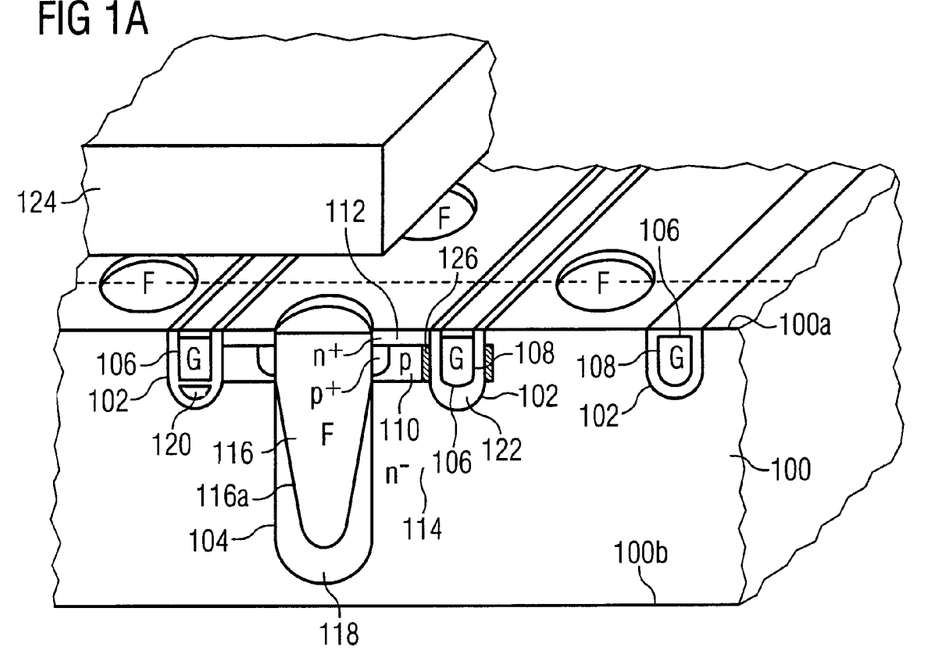
FIG. 1a is a schematic cross-sectional view of a semiconductor structure according to a first embodiment.

FIG. 1a shows an embodiment where the semiconductor structure is a vertical field-effect transistor, where a plurality of gate trenches 102 are arranged in a substrate 100, which extend in strip-shape in parallel to a first main surface 100a. Further, a plurality of field electrode trenches 104 is formed in the substrate. Further, the gate trenches 102 and the field electrode trenches 104 extend in a direction from the first main surface 100a of the substrate 100 towards a second main surface 100b of the substrate 100. The field electrode trenches have preferably a needle-shaped, spatially closed shape and are locally arranged in a mesa region between the gate trenches 102. In top view of the main surface 100a, the field electrode trenches 104 have a circular form, wherein the centers are formed in a regular arrangement at grid points of a regular grid.

In the gate trenches 102, a gate electrode region 106 is formed, which also extends in a strip-shaped way in parallel to the first main surface 100a. The gate electrode region 106 is insulated from the substrate 100 by an electrically insulating layer 108. A channel region 110 or body region, respectively, is formed at a lateral surface of the gate electrode region 106, which extends in parallel to the first main surface 100a between the strip-shaped gate trenches 102. In the direction towards the main surface 100a, a source region 112 is formed adjacent to the channel area 110, which also extends in parallel to the main surface 100a between the strip-shaped gate trenches 102. The channel region 110 has a first doping, for example a p-doping, while the source region 112 has a high dopant with opposite dopant type, i.e. an $n^+$-doping. A drain region 114 with a drain-drift path is formed adjacent to the channel region 110, in the direction towards the second main surface 100b, which is also doped with the second charge carrier type, i.e. an n charge type.

The field electrode trench 104 has a field electrode region 116, which is formed from a conductive material, for example doped polysilicon, metal or other conductive materials used in semiconductor technique. Further, an electrically insulating layer 110 is formed in the field electrode trench 104 between the field electrode region 116 and an inner surface of the trench 104. In an upper area, i.e. closer to the main surface 100a, the field electrode trench 104 has no electrically insulating layer 118, to allow, on the one hand, electric contact with the source region 112 via side wall contacting, and, on the other hand, to allow electric contact with a heavily doped $p^+$-region in the channel region 110.

Further, the gate trench 102 can have a further field electrode region 120, which is disposed in an electrically insulated way from the gate electrode region 106 below the gate electrode region 106, for example at a bottom of the gate trench 102. Further, the gate trench 102 can also have an insulating region, which is formed in a significantly thicker way compared to the gate insulating layer or gate oxide layer, respectively, arranged at the lateral walls of the gate trench 102. The thick insulating region 122 below the gate electrode region 106 and the further field electrode region 120 below the gate electrode region 106 can serve for reducing a gate-drain capacitance or gate charge, respectively. Advantageously, therefore, the further field electrode region 120 is preferably connected to a source potential.

A metal layer 124 is formed on the whole first main surface 100a, which has an electric contact to the source region 112 and is thus also referred to as source metallization.

The semiconductor structure illustrated in FIG. 1a represents a vertical gate trench transistor, where a vertical channel 126 can be formed on a lateral surface of the gate trench 102, by applying an appropriate potential to the gate electrode region 106.

If a field-effect transistor without field plates is operated in cut-off direction, a space-charge zone is formed at the transition from the channel region 110 to the drain-drift region of the drain region 114, where freely movable charge carriers are depleted. With high applied voltages, this can cause an avalanche breakdown, which can destroy the semiconductor device with too high energy deposition.

The inventive field electrode regions 106 have the effect, that the breakdown voltage, where the avalanche breakdown occurs, can be significantly increased, by depleting the drift zone region substantially in a lateral way, i.e. beginning from a lateral surface of the field electrode trench 104. In other words, the drain-drift region is depleted of free charge carriers, so that the positively charged acceptors of the drain-drift region generate an electric field, which effects a corresponding counter charge in the electrically conductive electrode region on the surface. Thus, the charge depletion is no longer performed exclusively via the p-n-junction of the drain/source region, but also via the field electrode region 116, which is preferably electrically connected to source and/or channel region 110 or body contact, respectively. Thereby, a deeper and more highly doped drift zone region can be depleted, which increases the cut-off voltage and reduces the turn-on-resistance.

The inventive needle-shaped embodiment with curved external surface 116a of the field electrode region 116 allows, on the one hand, that the space available for the drain-drift region is only slightly limited by the field electrode trenches 104, which are arranged in a localized and point-shaped way. Particularly, a significant advantage compared to the prior art is that the drain-drift region is not fully divided, but represents a contiguous region, which merely has inactive regions at predetermined points by the field electrode trenches 104. Compared to the prior art, the active region of the drain-drift region is only insignificantly limited.

Particularly, effective depletion is obtained by the circular structure of the field electrode region 116 in top view on the main surface 100a, which allows charge carriers to accumulate along the whole circular lateral surface of the field electrode region 116, which has the effect that an electric lateral effective field, as described above, can be increased for increasing the breakdown voltage at the p-n-junction between source region 112 and drain region 114.

The electrically insulating layer 118, which can, for example, be a field oxide, has a non-constant thickness in the embodiment shown in FIG. 1a, wherein the thickness of the electrically insulating layer 118 increases with increasing distance from the main surface 100a, whereas a diameter or a maximum extension, respectively, in parallel to the main surface 100a of the field electrode region 116 decreases with increasing distance from the first main surface 100a. This has the effect of a more constant field distribution in the space-charge zone in the cut-off case across the depth. In other embodiments, however, the field oxide in the field electrode trench 104 can be implemented homogeneously across the depth, which has the advantage of a significantly easier production method.

In the embodiment shown in FIG. 1a, the field electrode trenches 104 or the field electrode regions 116, respectively, are arranged in a region between the gate electrode regions 106. This has the advantage of a simple connection to the source metallization, which can be realized together with source and body contacts. Advantageous is thereby the arrangement of field electrode trenches or field electrode regions 116, respectively, in the middle of the mesa regions. On the other hand, the field electrode region can also be connected to source and/or body via a side wall contact.

It is a particular advantage when the field electrode regions are arranged between the gate trenches 102, such that every point in the drift path of the drain region 114 has a distance to the next field electrode region 116 or field electrode trench 104, respectively, which is as small as possible. For obtaining this advantage, a square raster or a hexagonal raster is optimal.

Figure 1B:
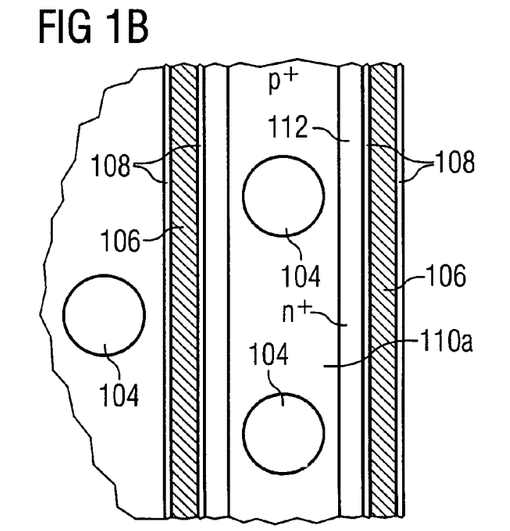

FIG. 1b shows a top view on the semiconductor structure according to FIG. 1a, with a regular point-shaped arrangement of the field electrode trenches 104 between the strip-shaped formed gate electrode regions 106. As can be seen, the field electrode trenches 104 are arranged in a region 110a with a p$^+$-doping of the channel region 110, so that electric contacting with the channel region 110 is obtained via the side wall.

Figure 2:
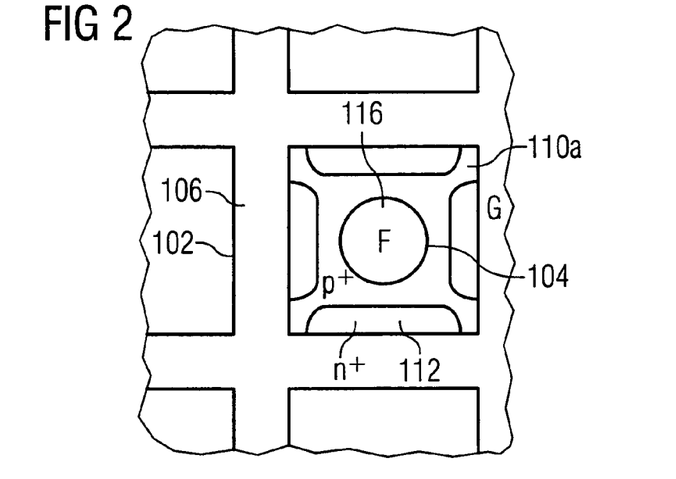
FIG. 2 is a schematic top view of a semiconductor structure according to a further embodiment.

FIG. 2 shows a development of the embodiment shown in FIG. 1a, wherein the gate trenches 102 and the gate electrode regions 106 are formed in a grid shape, which has the above-described advantages.

In the different figures, similar regions and structures are indicated with the same reference numbers, so that reference is made to the previous description with regard to corresponding further discussions concerning the structure and function of the regions or the structures in the following figures.

As can be seen, the field electrode trench 104 is formed with the field electrode range 116 in the middle of a square, which is formed by the strip-shaped gate trenches 102. Further, in contrast to the embodiment according to FIGS. 1a and 1b, the highly doped channel region 100a is formed such that it borders on the lateral faces of the gate trench 102 close to the edges of the square mesa region.

Figure 3A:
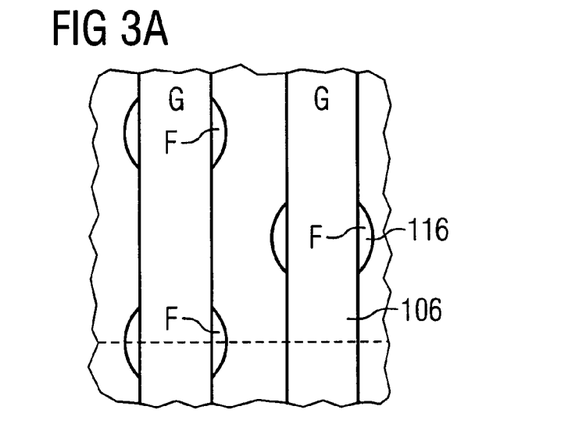
FIG. 3a is a schematic top view according to a further embodiment.

FIG. 3a shows a top view according to a further embodiment of the present invention. The field electrode trenches 104, formed circular in top view, are arranged in the region of the strip-shaped gate electrode region 106 and project laterally across the same.

Figure 3B:
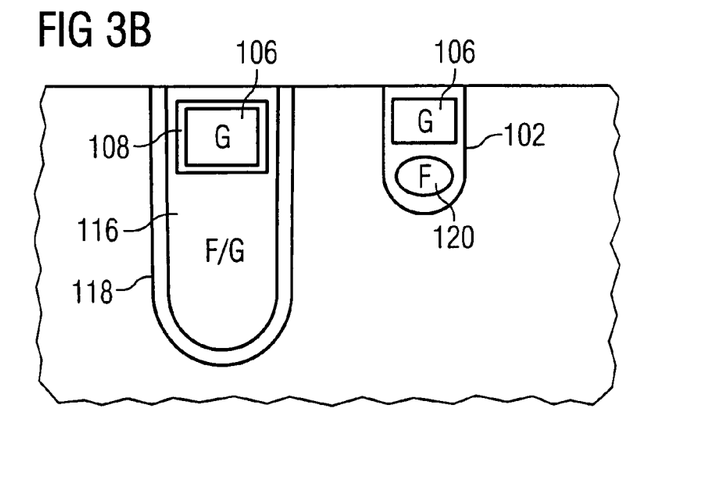

FIG. 3b shows a schematic cross-sectional representation of this embodiment, where it can be seen that the gate electrode region 106 is led through the field electrode trenches 104. Thereby, the gate electrode region 106 is fully insulated from the field electrode region 116 by the electrically insulating layer 108. Further, corresponding to FIG. 1a, the gate electrode region 106 is arranged in a gate trench 102 outside the field electrode trench 104, which also has a field electrode region 120 for reducing a gate-drain capacitance.

Thus, in the embodiment shown in FIGS. 3a and 3b, the field electrode region and the field electrode trench are directly in or below the gate trench, respectively. This arrangement is particularly space saving, since the cell area only has to be designed for the gate trench and the contacts.

Advantageously, the field electrode region for reducing the gate-drain capacitance is placed below the gate electrode area across the whole gate trench length. Thereby, it can be allowed to contact the field electrode region in a space saving way at the edge of the transistor.

Figure 4A:
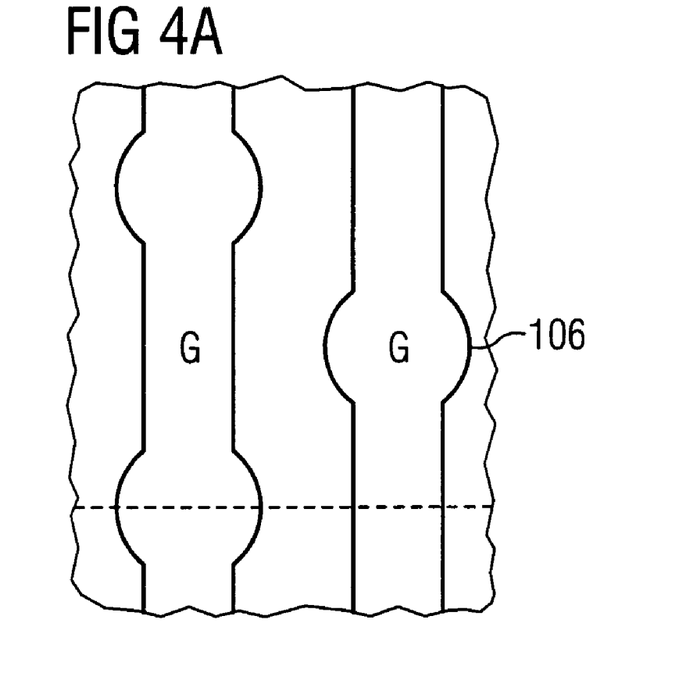
FIG. 4a is a schematic top view according to a further embodiment.
Figure 4B:
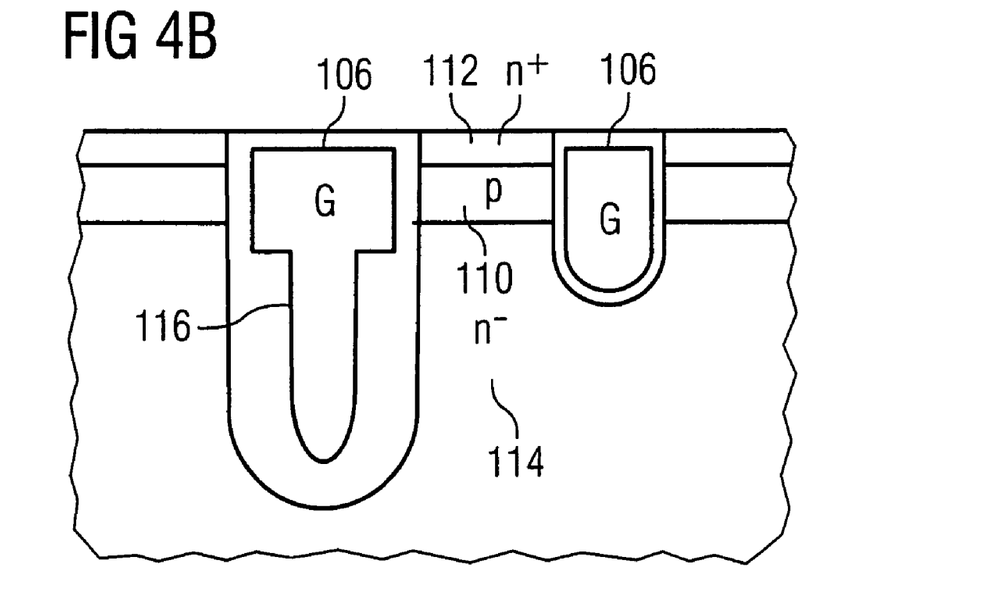

FIG. 4a shows a top view of a further embodiment of the present invention, where the gate electrode area 116 is also led through the field electrode trench 104. However, in contrary to FIGS. 3a and 3b, in the embodiment according to FIG. 4a, the field electrode region is connected to a gate potential or the field electrode region 116 is formed contiguously with the gate electrode region 106 in the needle-shaped field electrode trenches 104, respectively. FIG. 4b shows a cross-sectional representation of the semiconductor structure shown in FIG. 4a. A particular case of the embodiment according to FIGS. 4a and 4b is that compared to the field plate trenches in strip-shape according to the prior art, a reduced gate-drain capacitance is obtained by the spatially separated arrangement of the field electrode trenches 104 with sufficient distances of the same.

Figure 5A:
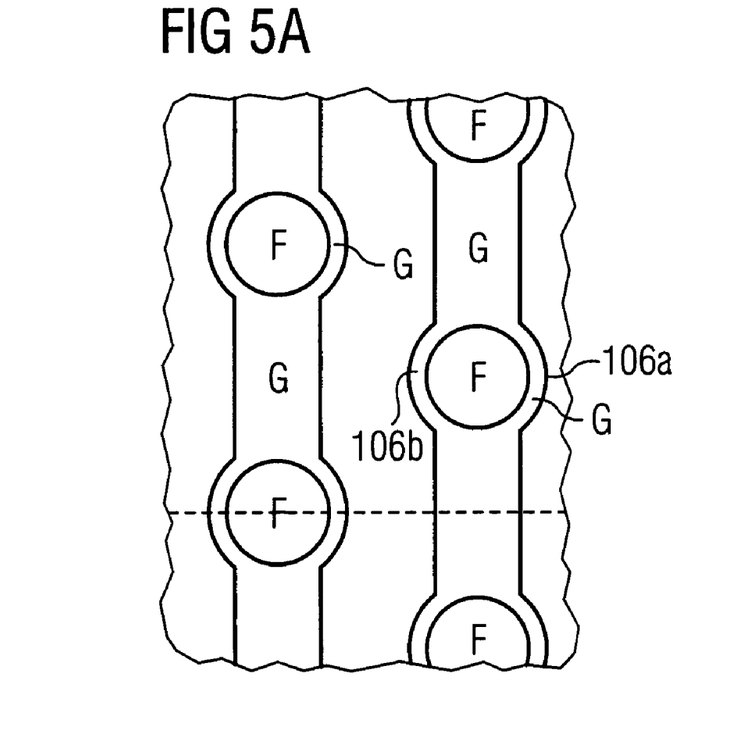
FIG. 5a is a schematic top view according to one embodiment.

FIG. 5a shows a semiconductor structure in top view, which is a development of the embodiment illustrated in FIGS. 3a and 3b.

In this embodiment, the field electrode region is inside with regard to the gate electrode region, wherein the strip-shaped gate electrode region at the positions of the field electrode regions 116 is split into first and second gate electrode subregions 106a and 106b, so that the gate electrode region 106 fully surrounds the field electrode region 116.

Figure 5B:
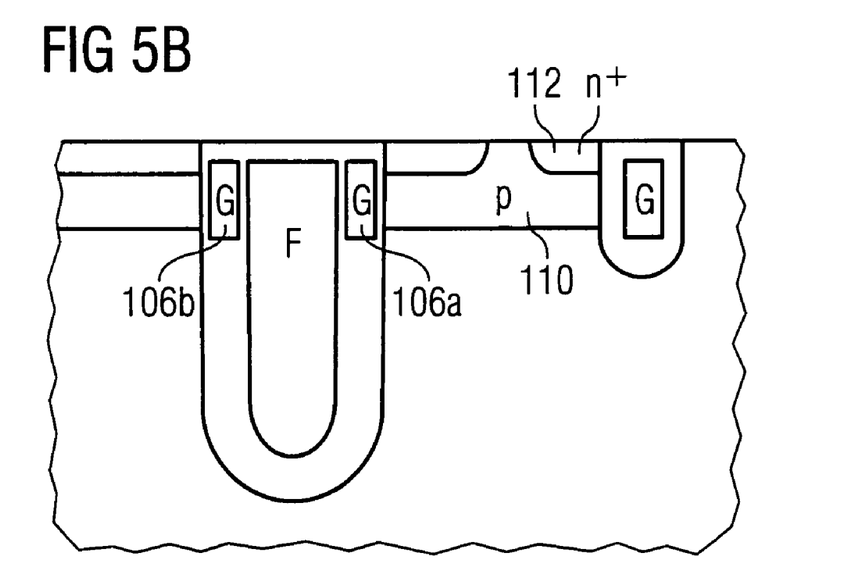

FIG. 5b shows a cross-sectional illustration of the semiconductor structure shown in FIG. 5a, wherein it can be seen that the gate electrode subregions 106a and 106b are each formed laterally at an upper region of the field electrode region 116.

Figure 6:
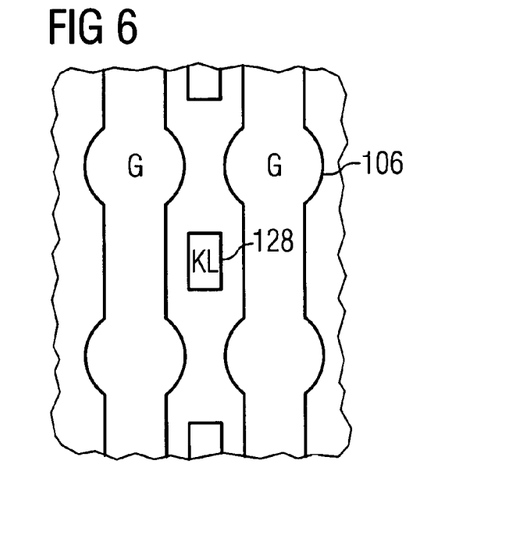
FIG. 6 is a schematic top view of a semiconductor structure according to one embodiment.

Further FIG. 6 shows a development of the semiconductor structure shown in FIGS. 4a and 4b, wherein additionally contact vias 128 are provided, to allow electric contacts to underlying semiconductor structures, for example the source region or the channel region.

The embodiments shown in FIGS. 2 to 6, where the field electrode region 116 overlaps the gate electrode region 106 in top view, have the particular advantage that an electric field can also be generated in parallel to the strip-shaped gate electrode regions 106 by the compact needle-shaped form with curved external surface, in order to increase the breakdown voltage. Thereby, the drain regions below the strip-shaped gate electrode regions 106 between the respective field electrode trenches 104 can be effectively depleted, wherein further the above-mentioned advantages of a significantly reduced gate-drain capacitance is obtained by the point-shaped arrangement as well as the increase of the area available for charge carrier transport in the drain region.

Although the present embodiments have been illustrated with regard to a vertical field-effect trench transistor with n conductive channel, the present invention can also be applied to drain up structures, p-channel transistors or IGBTs.

In the shown embodiments, the field electrode region 116 is electrically insulated from the drain-drift region by an electrically insulating layer 118. The field electrode region 116 can have a doped semiconductor region, which also has a charge carrier type opposite to the drain-drift region. Thereby, a small p-n-region is formed at the lateral surfaces of the p-doped field electrode region 116, which has the effect that the drain-drift region is laterally depleted, so that also an increase of the breakdown field strength is obtained at the p-n-junction at the interface between the drain region 114 and the channel region 110.

For operating the semiconductor structure, an electric voltage is applied to the field electrode region 106, wherein the applied potential can be a source potential or a gate potential.

The applied voltage has the effect that the drain region 114 is laterally depleted, so that a breakdown voltage at the interface between the channel region 110 and the drain region 114 is reduced.

With reference to FIG. 7a to 7f, a method for producing an embodiment according to the present invention will be discussed in more detail.

Figure 7A:
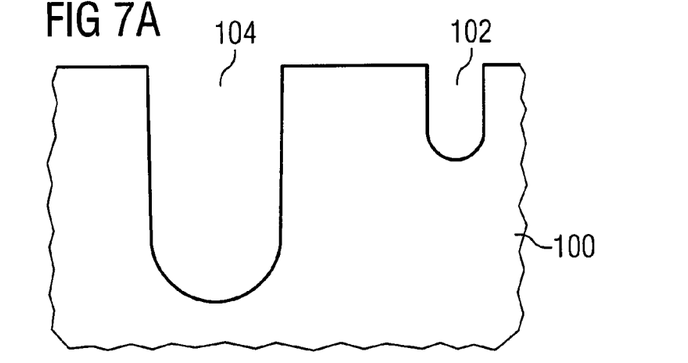
FIG. 7a to 7f are schematic cross-sectional illustrations representing the method steps of a production method according to an embodiment of the present invention.

In the substrate 100, trench etching is performed, by forming a trench hard mask on the surface 110. Here, the effect can be used that in current units, broader trenches are etched deeper than narrow ones. Thereby, both the gate trench 102 and the field electrode trench 104 can be etched in one method step, as illustrated in FIG. 7*a*. Alternatively, two trench masks and two trench etchings can be provided.

Figure 7B:
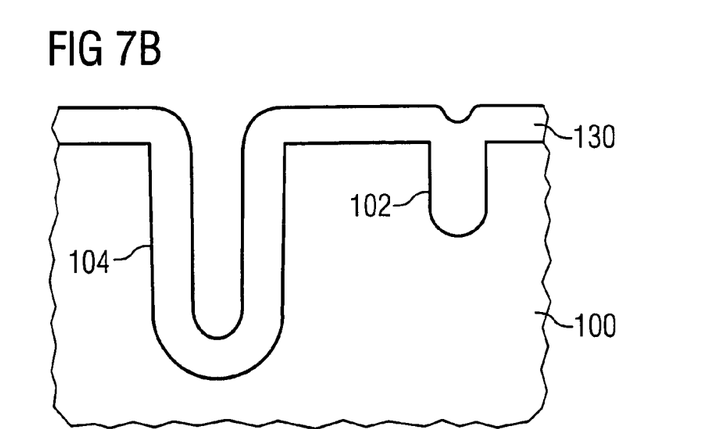
Figure 7C:
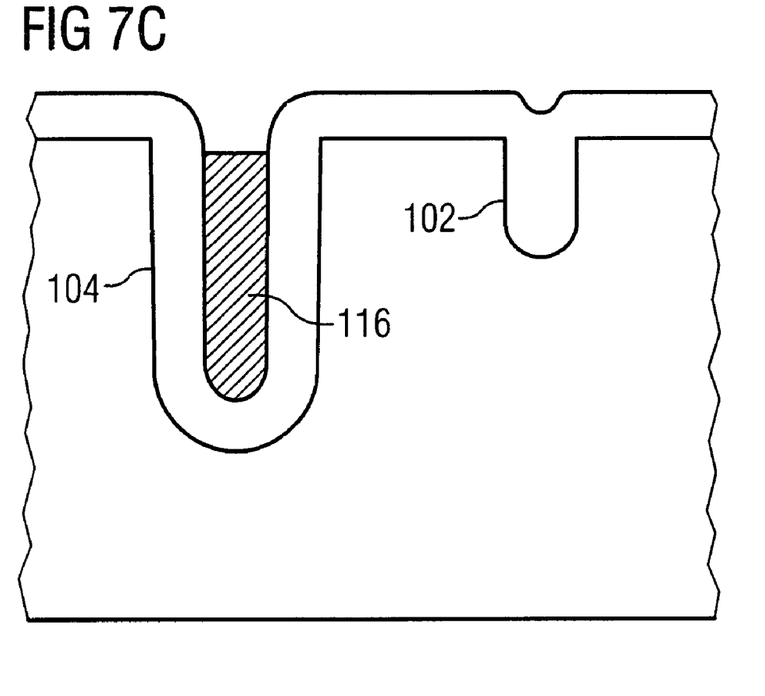

Then, a field oxide layer is deposited or generated via thermal oxidation. FIG. 7*b* shows the structure of FIG. 7*a* after depositing the field oxide layer 130. In the field electrode trench, the field oxide layer forms the electrically insulating layer 118. The thickness is preferably chosen such that the gate trench 102, but not the field electrode trench 104, is fully filled, so that it can be ensured that in a subsequent step of depositing a polysilicon, the polysilicon is merely deposited in the field electrode trench 104 and not in the gate electrode trench 102, so that the polysilicon forms the field electrode region 116.

After depositing the polysilicon on the field oxide area in the field electrode trench, a polyrecess is performed, see FIG. 7*a*, and then etching back of the field oxide, to fill the gate trench 102 as well as regions arranged on the side of the field electrode region 106 with the electrically conductive gate electrode material in a further process. Thereby, the gate electrode region 106 is formed.

Figure 7D:
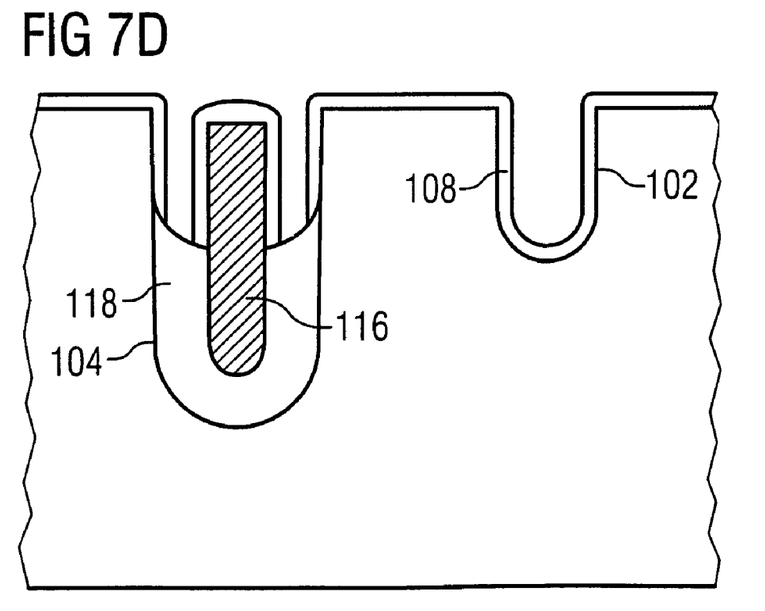
Figure 7E:
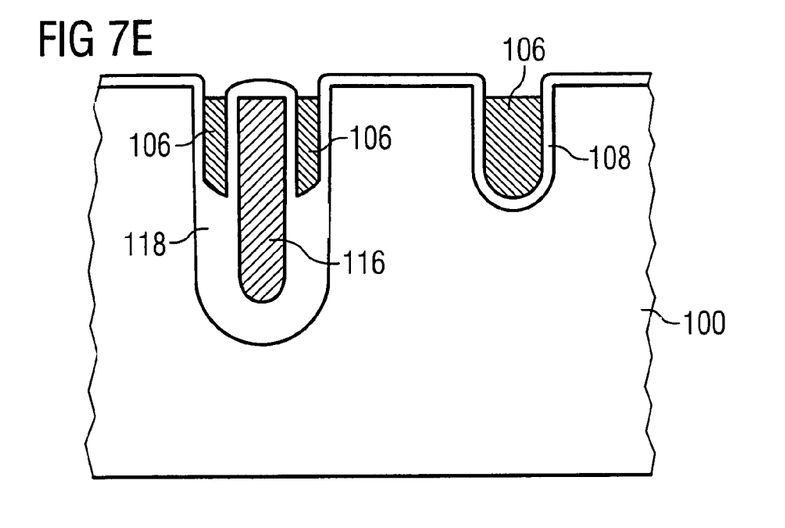

After etching back the field oxide, a gate oxide is generated at the side walls, for example via growing a gate oxide. FIG. 7*d* shows the semiconductor structure illustrated in FIG. 7*c* after performing etching back of the field oxide and the gate oxide growth.

In a subsequent step, the gate electrode region 106 is generated, for example by depositing a gate polysilicon material. The gate polysilicon layer is etched back and, if necessary, masked to allow later contacting of the gate electrode on the semiconductor surface.

Then, the doping regions are formed, wherein in other embodiments the formation of the doping regions can also be performed at another suitable stage of the production method, for example before or after.

An intermediate oxide layer 138 is deposited to achieve electrical insulation of the gate electrode and field electrode region from the source metallization layer on the first main surface 100*a*.

Figure 7F:
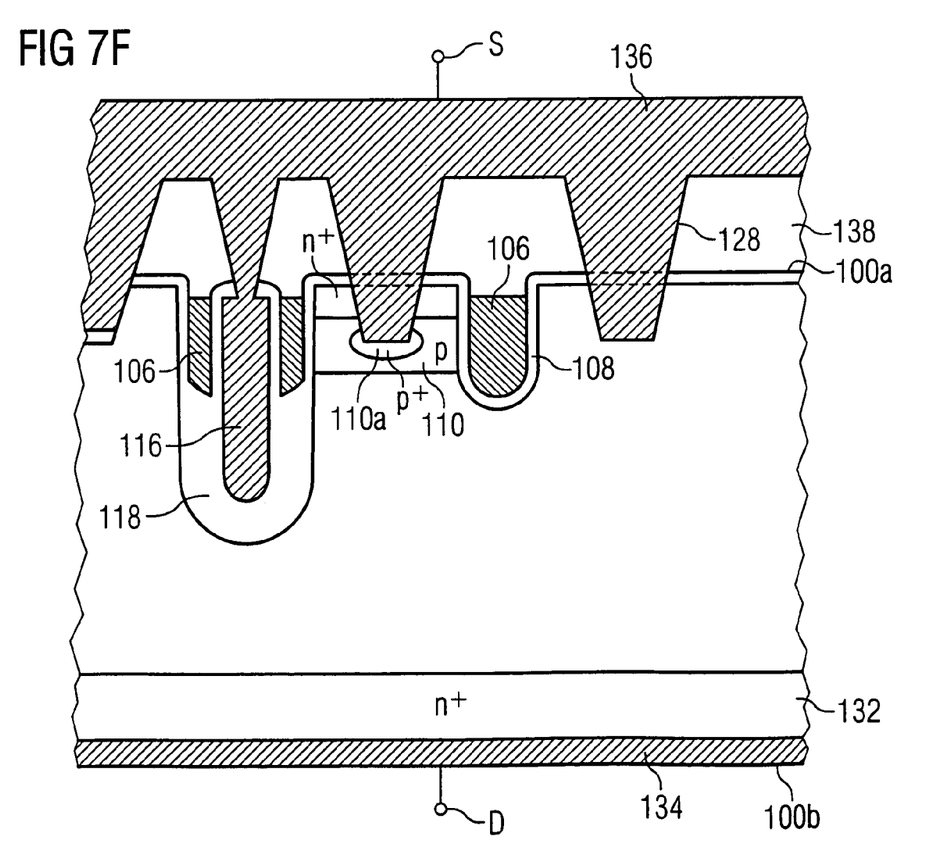

For electric contacting, contact via etching is performed to generate the contact vias 128. The contact vias are filled with an electrically conductive material, for example by depositing metallization. FIG. 7*f* shows the semiconductor structure illustrated in FIG. 7*e* after performing the above method steps. Here, it can be seen that the drain terminal on the second main surface 100*b* is made via a highly doped region 132 and a drain terminal 134. The source terminal is made via the metallization layer 136 deposited on the first main surface 100*a*.

The described embodiment of a production method has the advantage that the field electrode region can be directly connected to the source metallization without additional steps. In a further embodiment, the field electrode trench 104 can be etched, for example, only after contact via etching. This has the advantage that the metallization or a metallization plug can be used as field electrode material and the polysilicon deposition for forming the field electrode region 116 can be omitted.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A semiconductor structure comprising:
   a substrate with a first main surface and a second main surface;
   a gate electrode region comprising a plurality of gate strips;
   a channel region, wherein a vertical conductive channel is generated in the direction from the first main surface to the second main surface;
   a gate electrode insulation between the gate electrode region and the channel region;
   a drain region;
   a field electrode region with a curved external surface for increasing a breakdown voltage of the semiconductor structure, wherein the field electrode region has an extension in every direction in parallel to the first main surface, which is smaller than a maximum extension in a direction perpendicular to the first main surface; and
   an electrically insulating layer arranged between the field electrode region and the drain region.

2. The semiconductor structure according to claim 1, wherein the field electrode region has a ratio of a maximum extension in parallel to the first main surface-to a maximum extension perpendicular to the first main surface that lies in a range of 0.05 to 0.5.

3. The semiconductor structure according to claim 1, wherein a maximum extension of the field electrode region in parallel to the first main surface is less than 2 µm.

4. The semiconductor structure according to claim 1, wherein the field electrode region has a circular shape, a shape of a regular n-angle or a ring shape in a top view of the first main surface.

5. The semiconductor structure according to claim 1, wherein the field electrode region is fully filled with conductive material within the curved external surface, so that the field electrode region has merely an external surface and no internal surface.

6. The semiconductor structure according to claim 1, wherein a cross section of the field electrode region is reduced in the direction away from the first main surface in parallel to the first main surface.

7. The semiconductor structure according to claim 1, further having a drain-drift region, wherein the field electrode region is electrically insulated from the drain-drift region.

8. The semiconductor structure according to claim 1, further having a source region, wherein the field electrode region is electrically connected to the source region and/or the channel region and/or the gate region.

9. The semiconductor structure according to claim 8, wherein the field electrode region abuts on the channel region and/or the source region.

10. The semiconductor structure according to claim 1, wherein the field electrode region has a plurality of spatially separated field electrode subregions, the centers of which are preferable arranged at grid points of a regular grid.

11. The semiconductor structure according to claim 1, wherein the gate electrode region is arranged in a gate trench.

12. The semiconductor structure according to claim 11, wherein a further field electrode region is arranged in the gate trench.

13. The semiconductor structure according to claim 1, wherein the field electrode region and the gate electrode region are formed contiguously.

14. The semiconductor structure according to claim 1, wherein the gate electrode region and the field electrode region are arranged in a common trench.

15. The semiconductor structure according to claim 1, wherein the gate electrode region is formed strip-shaped in a top view on the first main surface.

16. The semiconductor structure according to claim 15, wherein the gate electrode region has a grid-shaped structure in a top view on the first main surface, which is preferable a square grid structure or a hexagonal grid structure.

17. The semiconductor structure according to claim 1, wherein the gate electrode region splits late a first gate electrode subregion and a second gate electrode subregion, wherein the field electrode region is fully enclosed by the first and second gate electrode subregions in a top view on the first main surface.

18. The semiconductor structure according to claim 1, wherein the semiconductor structure is arranged in a cell and the gate electrode region is arranged in a gate trench, wherein a ratio of $p/w_T$ is in a ranged of 1.2 to 1.6, wherein $w_T$ is the gate trench width and p the cell pitch.

19. A semiconductor structure, comprising:
a substrate with a first main surface and a second main surface;
a gate electrode region comprising a plurality of spatially spaced gate electrode subregions in the form of gate strips;
a channel region, wherein a vertical conductive channel is generated in the direction from the first main surface to the second main surface;
a gate electrode insulation between the gate electrode region and the channel region;
a drain region;
a spatially closed needle-shaped field electrode region with a curved external surface, which extends in a region having no gate electrode regions between the plurality of spatially spaced gate electrode regions; and
an electrically insulating layer arranged between the field electrode region and the drain region.

20. The semiconductor structure according to claim 19, wherein the field electrode region has a center in top view on the first main surface, which is arranged at a center of the region having no gate electrode regions.

21. The semiconductor structure according to claim 19, wherein the field electrode region has a circular shape, a shape of a regular n-angle or a ring shape in a top view on the first main surface.

22. The semiconductor structure according to claim 19, wherein the field electrode region is fully filled with conductive material within the curved external surface, so that the field electrode region has merely an external surface and no internal surface.

23. The semiconductor structure according to claim 19, wherein a cross section of the field electrode region is reduced in the direction away from the first main surface in parallel to the first main surface.

24. The semiconductor structure according to claim 19, further having a drain-drift region, wherein the field electrode region is electrically insulated from the drain-drift region.

25. The semiconductor structure according to claim 19, further having a source region, wherein the field electrode region is electrically connected to the source region and/or the channel region and/or the gate region.

26. The semiconductor structure according to claim 25, wherein the field electrode region abuts on the channel region and/or the source region.

27. The semiconductor structure according to claim 19, wherein the field electrode region has a plurality of spatially separated field electrode subregions, the centers of which are preferable arranged at grid points of a regular grid.

28. The semiconductor structure according to claim 19, wherein the gate electrode region is arranged in a gate trench.

29. The semiconductor structure according to claim 28, wherein a further field electrode region is arranged in the gate trench.

30. The semiconductor structure according to claim 19, wherein the field electrode region and the gate electrode region are formed contiguously.

31. The semiconductor structure according to claim 19, wherein the gate electrode region and the field electrode region are arranged in a common trench.

32. The semiconductor structure according to claim 19, wherein the gate electrode region is formed strip-shaped in a top view on the first main surface.

33. The semiconductor structure according to claim 32, wherein the gate electrode region has a grid-shaped structure in a top view on the first main surface, which is preferably a square grid structure or a hexagonal grid structure.

34. The semiconductor structure according to claim 19, wherein the gate electrode region splits into a first gate electrode subregion and a second gate electrode subregion, wherein the field electrode region is fully enclosed by the first and second gate electrode subregions in a top view on the first main surface.

35. The semiconductor structure according to claim 19, wherein the semiconductor structure is arranged in a cell and the gate electrode region is arranged in a gate trench, wherein a ration of $p/w_T$ is in a range of 1.2 to 1.6, wherein $w_T$ is the gate trench width and p the cell pitch.

36. A semiconductor structure, comprising:
a substrate with a first main surface and a second main surface;
a gate electrode region wherein the gate electrode region has an elongated strip portion;
a channel region, wherein a vertical conductive channel is generated in the direction from the first main surface to the second main surface;
a gate electrode insulation between the gate electrode region and the channel region;
a drain region; and
a field electrode region with a curved external surface, wherein the field electrode region is arranged such that an electric effective field for increasing a breakdown voltage of the semiconductor structure can be generated across the curved external surface, which is at least partly parallel to the elongated strip portion; and
wherein the external surface of the field electrode region comprises a circular form in a projection on one of the main surfaces of the substrate.

37. The semiconductor structure according to claim 36, wherein the field electrode region has a circular shape, a shape of a regular n-angle or a ring shape in a top view on the first main surface.

38. The semiconductor structure according to claim 36, wherein the field electrode region is fully filled with conductive material within the curved external surface, so that the field electrode region has merely an external surface and no internal surface.

39. The semiconductor structure according to claim 36, wherein a cross section of the field electrode region is reduced in the direction away from the first main surface in parallel to the first main surface.

40. The semiconductor structure according to claim 36, further having a drain-drift region, wherein the field electrode region is electrically insulated from the drain-drift region.

41. The semiconductor structure according to claim 36, further having a source region, wherein the field electrode region is electrically connected to the source region and/or the channel region and/or the gate region.

42. The semiconductor structure according to claim 41, wherein the field electrode region abuts on the channel region and/or the source region.

43. The semiconductor structure according to claim 36, wherein the field electrode region has a plurality of spatially separated field electrode subregions, the centers of which are preferable arranged at grid points of a regular grid.

44. The semiconductor structure according to claim 36, wherein the gate electrode region is arranged in a gate trench.

45. The semiconductor structure according to claim 44, wherein a further field electrode region is arranged in the gate trench.

46. The semiconductor structure according to claim 36, wherein the field electrode region and the gate electrode region are formed contiguously.

47. The semiconductor structure according to claim 36, wherein the gate electrode region and the field electrode region are arranged in a common trench.

48. The semiconductor structure according to claim 36, wherein the gate electrode region is formed strip-shaped in a top view on the first main surface.

49. The semiconductor structure according to claim 48, wherein the gate electrode region has a grid-shaped structure in a top view on the first main surface, which is preferably a square grid structure or a hexagonal grid structure.

50. The semiconductor structure according to claim 36, wherein the gate electrode region splits into a first gate electrode subregion and a second gate electrode subregion, wherein the field electrode region is fully enclosed by the first and second gate electrode subregions in a top view on the first main surface.

51. The semiconductor structure according to claim 36, wherein the semiconductor structure is arranged in a cell and the gate electrode region is arranged in a gate trench, wherein a ratio of $p/w_T$ is in a ranged of 1.2 to 1.6, wherein the $w_T$ is the gate trench width and p the cell pitch.

52. A method for operating a semiconductor structure, comprising:
  a substrate with a first main surface and a second main surface;
  a gate electrode region comprising a plurality of gate strips;
  a channel region, wherein a vertical conductive channel can be generated in the direction from the first main surface to the second main surface;
  a gate electrode insulation between the gate electrode region and the channel region;
  a drain region;
  a field electrode region with a curved external surface for increasing a breakdown voltage of the semiconductor structure, wherein the electrode region has an extension in every direction in parallel to the first main surface, which is smaller than a maximum extension in a direction perpendicular to the first main surface;
  an electrically insulating layer arranged between the field electrode region and the drain region;
  comprising the step of:
  applying a voltage to the field electrode region, whereby a lateral electric field is generated, which increases the breakdown voltage of the semiconductor structure.

53. The method according to claim 52, wherein the semiconductor structure has a drain-drift region, wherein in the step of applying a voltage the drain-drift region is fully depleted of free charge carriers by the voltage applied to the field electrode region.

54. A method for producing a semiconductor structure, comprising the steps of:
  providing a substrate with a first main surface and a second main surface; generating a gate electrode region comprising a plurality of gate strips in the substrate;
  generating a channel region, wherein a vertical conductive channel is generated in the direction from the first main surface to the second main surface;
  generating a field electrode region with a curved external surface for increasing a breakdown voltage of the semiconductor structure, wherein the field electrode region has an extension in every direction in parallel to the first main surface, which is smaller than a maximum extension in the direction perpendicular to the first main surface.

55. The method according to claim 54, further comprising the steps of:
  generating a gate trench;
  generating the gate electrode region in the gate trench.

56. The method according the claim 54, further comprising the steps of:
  generating a field electrode trench in the substrate; and
  generating the field electrode region in the field electrode trench.

57. The method according to claim 56, wherein a gate electrode trench is generated simultaneously with the field electrode trench.

58. The method according to claim 54, further comprising the step of generating a full-area metallization on the first main surface.

59. The method according to claim 54, further comprising the step of:
  generating an insulating layer on the first main surface;
  generating contact vias in the insulating layer;
  filling the contact vias with electrically conductive material.

60. A method for operating a semiconductor structure, comprising:
  a substrate with a first main surface and a second main surface;
  a gate electrode region comprising a plurality of spatially spaced gate electrode subregions in the form of gate strips;
  a channel region, wherein a vertical conductive channel can be generated in the direction from the first main surface to the second main surface;
  a gate electrode insulation between the gate electrode region and the channel region;
  a drain portion;
  a spatially closed needle-shaped field electrode region with a curved external surface, which extends in a region having no gate electrode regions between the plurality of spatially spaced gate electrode regions; and
  an electrically insulating layer arranged between the field electrode region and the drain region;
  comprising the step of:
  applying a voltage to the field electrode region, whereby a lateral electric field is generated, which increases the breakdown voltage of the semiconductor structure.

61. A method for operating a semiconductor structure, comprising:
  a substrate with a first main surface and a second main surface;
  a gate electrode region; wherein the gate electrode region has an elongated strip portion;

a channel region, wherein a vertical conductive channel can be generated in the direction from the first main surface to the second main surface;
a gate electrode insulation between the gate electrode region and the channel region;
a drain region; and
a field electrode region with a curved external surface, wherein the field electrode region is arranged such that an electric effective field for increasing a breakdown voltage of the semiconductor structure can be generated across the curved external surface, which is at least partly parallel to the elongated strip portion; and
wherein the external surface of the field electrode region comprises a circular form in a projection on one of the main surfaces of the substrate; comprising the step of:
applying a voltage to the field electrode region, whereby a lateral electric field is generated, which increases the breakdown voltage of the semiconductor structure.

* * * * *